United States Patent [19]

Takahashi et al.

[11] Patent Number: 4,703,218
[45] Date of Patent: Oct. 27, 1987

[54] PIEZO-ELECTRIC ASSEMBLY

[75] Inventors: Hiroyuki Takahashi, Takaoka; Isao Toyoshima, Ishikawa, both of Japan

[73] Assignee: Murata Manufacturing Co., Ltd., Japan

[21] Appl. No.: 925,827

[22] Filed: Oct. 30, 1986

[30] Foreign Application Priority Data

Nov. 6, 1985 [JP] Japan .................................. 60-249414

[51] Int. Cl.[4] ........................................... H01L 41/08
[52] U.S. Cl. ..................................... 310/348; 310/320
[58] Field of Search ................................ 310/320, 348

[56] References Cited

U.S. PATENT DOCUMENTS

| 4,086,696 | 5/1978 | Ikuta | 310/348 X |
| 4,633,124 | 12/1986 | Kawashima | 310/348 |

FOREIGN PATENT DOCUMENTS

| 0139391 | 10/1979 | Japan | 310/348 |
| 0093313 | 7/1980 | Japan | 310/348 |
| 0075017 | 5/1982 | Japan | 310/348 |
| 0148419 | 8/1984 | Japan | 310/348 |
| 0053314 | 3/1985 | Japan | 333/195 |

Primary Examiner—Mark O. Budd
Attorney, Agent, or Firm—Ostrolenk, Faber, Gerb & Soffen

[57] ABSTRACT

Piezo-electric assembly having a piezo-electric resonator of trapped energy type assembled within a forming case. A bulkhead within the case prevents manufacturing defects due to internal spreading of conductive paste, regardless of variations in the coating amount of the conductive paste in mass production or variations in the mount pressure. Constant clearance exists between the internal connecting portions of the external terminals and the draw-out electrode (input/output) electrodes of the resonator, so that any variation in the conductive paste coating amount or the mount pressure is compensated.

5 Claims, 9 Drawing Figures

PIEZO-ELECTRIC ASSEMBLY

BACKGROUND OF THE INVENTION

The present invention generally relates to piezo-electric parts and more particularly, to a piezo-electric assembly with a piezo-electric resonator of trapped energy type being built-in within a forming case.

Generally, a piezo-electric filter which is one example of a conventional piezo-electric assembly has a piezo-electric resonator 2 accommodated within such a forming case 1 as shown in FIG. 1. Connecting portions 3, 4 formed on the bottom face of the forming case and the electrodes 5, 6 formed on the piezo-electric resonator 2 are electrically connected with conductive pastes 7, 8 and mechanically fixed with each other.

When the piezo-electric resonator 2 is mounted within the case 1 with the use of the conductive pastes 7, 8 in the conventional piezo-electric filter shown in FIG. 1, the conductive pastes 7, 8 are likely to be spread out of the given position because of the dispersion or variation of the coating amount of the conductive pastes 7, 8 and the dispersion or variation of the mount pressure. When the conductive paste is diffused more than necessary, the isolation between the input and the output may be degraded, the input and output terminals may be shorted, or the oscillation electrode portion may be damped, thus causing the dispersion or variation of various characteristics.

SUMMARY OF THE INVENTION

Accordingly, an object of the present invention is to prevent the above-described inconveniences from being caused even if the mount pressure or the coating amount of the conductive paste varies in mass production.

The solution to these conventional problems according to an aspect of, the present invention, is to provide a piezo-electric assembly, wherein in a piezo-electric parts including a forming case having connecting portions formed on its bottom portion to draw out the outer portion, a piezo-electric resonator of trapped energy type accommodated in the forming case with the electrode to be connected with the connecting portions being formed while being drawn out to the end of the position corresponding to the connecting portion, the electrode being connected with the connecting portion with conductive cement, a bulkhead for preventing the conductive cement from being diffused into the undesired portion is provided on the bottom portion of the case, the piezo-electric resonator is fixedly placed on the bulkhead.

Constant clearance exists between the connecting portion and the draw-out electrode of the resonator so that the dispersion between the conductive paste coating amount and the mount pressure is absorbed.

According to the present invention, the deterioration of the isolation between the input and output is removed because of the above-described operation so that the bottom level in the attenuation is provided in better reproducibility to remove the dispersion for each product. The inner short, the oscillation damping are removed, thus resulting in better yield, improved reliability.

BRIEF DESCRIPTION OF THE DRAWINGS

This and other objects and features of the present invention will become apparent from the following description of an embodiment thereof with reference to the accompanying drawings, in which.

DETAILED DESCRIPTION OF THE INVENTION

Figure 1:
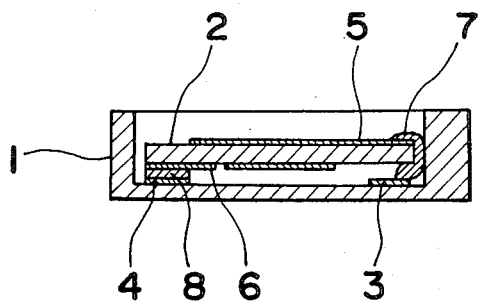
FIG. 1 is a cross-sectional view of a conventional piezo-electric filter as already mentioned above.

Before the description of the present invention proceeds, it is to be noted that like parts are designated by like reference numerals throughout the several views of the accompanying drawings.

Referring now to the drawings, there is shown; a piezo-electric assembly according to an embodiment of the present invention.

In FIGS. 1 to 7, a piezo-electric filter 10 which is one example of a piezo-electric assembly includes a forming case 12 and a piezo-electric resonator 14 of trapped energy type accommodated within it.

Figure 5:
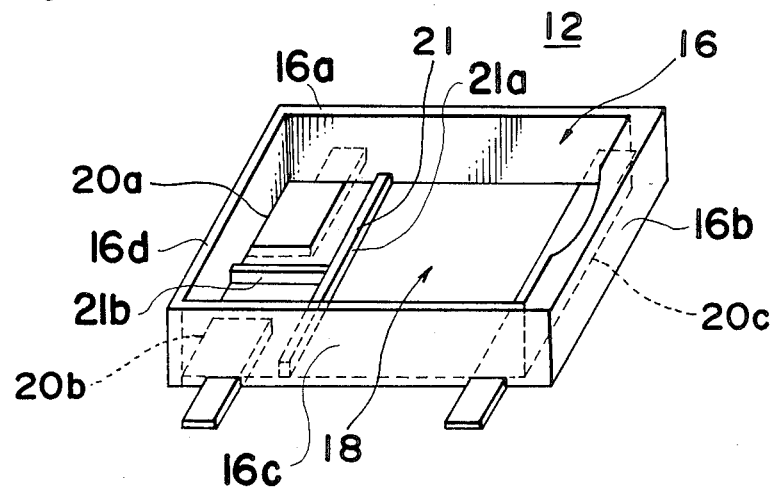
FIG. 5 is a perspective view of a case to be employed in the filter of FIG. 2.
Figure 3:
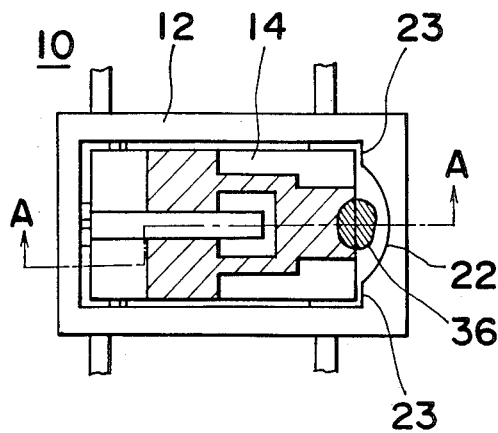
FIG. 3 is a plan view, with the cap removed, of the filter of FIG. 2.

As shown in FIG. 5, the forming case 12 has a rectangular side wall 16 comprising opposite long sides 16a, 16c and opposite short sides 16b, 16d, and a bottom portion 18. The terminals 20a, 20b and 20c to be externally connected are respectively insert-molded on the bottom portion 18. The terminal 20a extends outwardly from one end of the side 16a, and the terminal 20b extends outwardly from the corresponding end of the side wall 16c. The terminal 20c is formed at the opposite end from these terminals 20a and 20b and extends outwardly from both the sides 16a, 16c of the side wall 16. The terminal 20c operates as an earth terminal. As shown clearly in FIG. 5, a T-shaped bulkhead 21 comprises a long portion 21a and a short portion 21b. The portion 21a extends from side 16a to side 16b, close substantially parallel to the terminals 20a, 20b, and portion 21b extends from portion 21a to side 16d, between the terminals 20a, 20b. The terminal 20c is embedded in the bottom portion 18. A notch 22 is formed on the side 16b corresponding to the earth terminal 20c of the side wall 16 of the case 12 as shown in FIG. 3. The notch 22 operates as a detour path for the conductive paste 36c, as described later.

Figure 8:
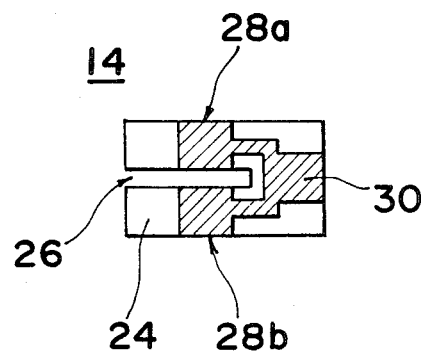
FIG. 8 is a plan view of a piezo-electric resonator to be employed in the filter of FIG. 2.

As shown in FIG. 8, the piezo-electric resonator 14 is constructed as a trapped energy type of thickness shear vibration mode of three-terminal form in this example. However, the mode of such piezo-electric resonator 14 is not restricted to such thickness shear (TS) mode as described hereinabove.

The piezo-electric resonator 14 includes a plate-shaped piezo-electric unit 24. A slit 26 is cut from one end in the length direction and is formed in the approximate center of the width direction of the piezo-electric unit 24. Common electrodes 28a and 28b which enclose the slit 26 therebetween is formed on the top face of the piezo-electric unit 24 shown in FIG. 8, these common electrodes 28a and 28b being commonly connected with an earth electrode 30 formed at the end opposite the slit 26 in the length direction of the piezo-electric unit. Also, a pair of split electrodes 32a and 32b, each having a split defined therein, are formed on the bottom face of the piezo-electric resonator 14 shown in FIG. 9, corresponding to the respective common electrodes 28a and 28b formed on the top face. Split electrode 32a comprises portions 32a' and 32a'', which are respectively toward and away from the end in which the slit 26 is formed. Similarly, split electrode 32b comprises portions 32b' and 32b''. Portions 32a'' and 32b'' are connected together. The portions 32a' and 32b' of the split electrodes 32a and 32b are respectively connected with the draw-out (or input/output) electrodes 34a and 34b formed at the end of the bottom face opposite to the above-described earth electrode 30 on the piezo-electric unit 24.

Figure 4:
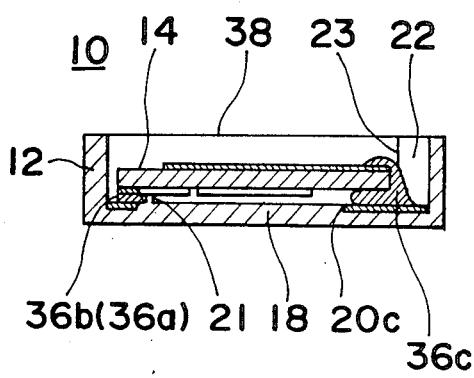
FIG. 4 is a cross-sectional view, taken along line A—A, of the filter of FIG. 3.
Figure 6:
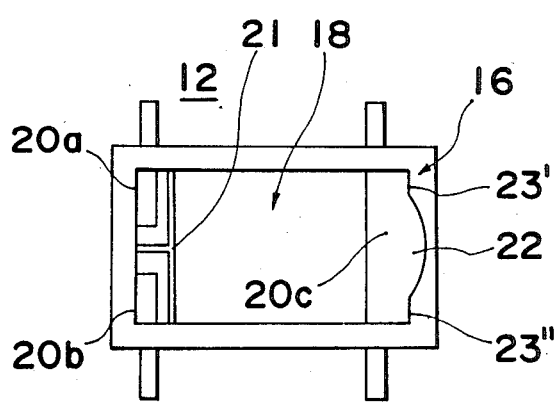
FIG. 6 is a plan view of the case of FIG. 5.
Figure 7:
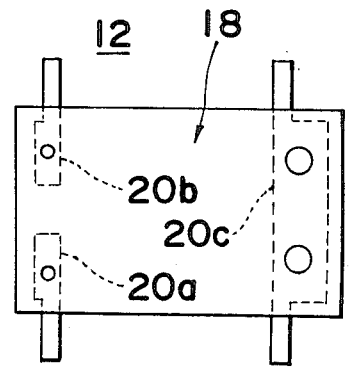
FIG. 7 is a bottom view of the case of FIG. 5.
Figure 9:
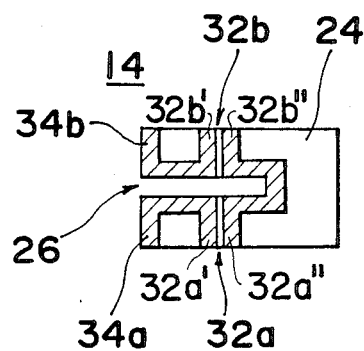
FIG. 9 is a bottom view of the resonator of FIG. 8.

Such a piezo-electric resonator 14 as shown in FIG. 8 and FIG. 9 is accommodated, as shown in FIG. 3, within such a forming case 12 as shown in FIG. 6. Namely, the piezo-electric resonator 14 is in contact against the bulkhead 21 towards the draw-out electrodes 34a, 34b. The bulkhead portion 21a contacts the resonator 14 between the split electrodes 32a, 32b and the draw-out electrodes 34a, 34b with the bottom face of the piezo-electric resonator 14 being directed toward the bottom portion 18 of the case 12 as shown in FIG. 4. Accordingly, a clearance exists between the oscillation portion of the piezo-electric resonator 14 and the bottom portion 18 in any circumstance to prevent any oscillation damping. At this time, at least part of the inner wall face of the side wall 16 of the forming case 12 operates to positioning the piezo-electric resonator 14. Even on the side 16b where the notch 22 as shown in FIG. 3 is formed, the portions 23', 23'' adjacent to sides 16a, 16c are located inwardly from the notch 22 so that they operate sufficiently for the positioning operation.

Also the terminals 20a and 20b are connected with the respective corresponding draw-out electrodes 34a and 34b by conductive paste 36a and 36b dripped thereon. Additionally, conductive paste 36c is dripped on the earth electrode 30 formed on the top face of the piezo-electric unit 14. The conductive paste 36c goes round as far as the bottom portion 18 through the comparative large gap between the end edge of the piezo-electric unit 24 and the inner face of the side wall 16 formed by the notch 22. Accordingly, the earth electrode 30 is electrically connected with the earth terminal 20c by the conductive paste 36c. The conductive paste 36c positively reaches the bottom face of the piezo-electric resonator through the notch 22 so that the electric connection and the mechanical connection may be made more positively as compared with the use of such a conventional notchless case as shown in FIG. 1.

The terminals 20a, 20b are surrounded by the bulkhead 21 so that the conductive pastes 36a, 36b cannot be diffused outside of the bulkhead 21, regardless of variations in the amount of the conductive paste 36a, 36b and in the mount pressure of the piezo-electric resonator 14. It is to be noted that a similar bulkhead (not shown) may be formed integrally with the bottom portion 18 along the longitudinal direction of, and enclosing, the terminal 20c.

Figure 2:
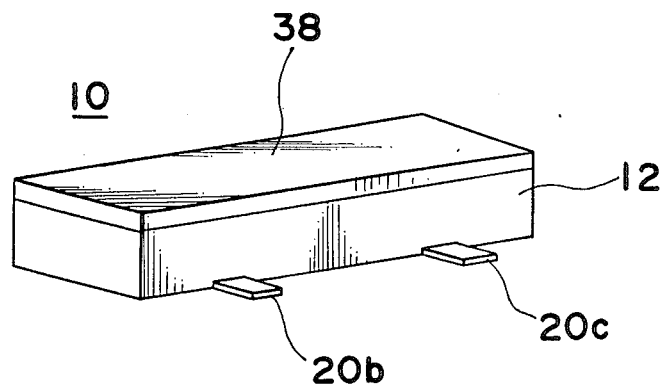
FIG. 2 is a perspective view of a piezo-electric filter assembled in accordance with one preferred embodiment of the present invention.

The piezo-electric resonator 14 is accommodated within the case 12 as shown in FIG. 3, is electrically connected and mechanically secured, and thereafter a rubber-shaped elastic member is filled into the molding case 12, if necessary. A cover or a cap 38 is secured with bonding agent to close the top of the case 12. The portions exposed externally of the terminals 20a, 20b and 20c are cut to proper length so that a chip-shaped piezo-electric filter as shown in FIG. 2 is provided.

Conductive bonding agent, which is synonymous with the conductive paste or solder and particularly cream solder (soldering paste), in addition to the conductive paste, may be used as conductive cement.

The piezo-electric resonator 14 in the embodiment is adapted to function as a band pass filter of two stages. Furthermore, the present invention may also be applied to a piezo-electric assembly such as a resonator for FM demodulation circuit use, a trap, an oscillator or the like.

Although an embodiment of the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. In a piezo-electric assembly which comprises
   a case including a bottom portion having a bottom interior surface; at least one internal terminal means having a top surface substantially flush with said bottom interior surface; at least one corresponding external terminal means outside said case; and at least one connector means extending through the bottom portion and electrically interconnecting said internal terminal means and said corresponding external terminal means;
   a piezo-electric element accommodated in said case, said element having at least one main electrode at a bottom surface thereof to be connected to said at least one internal terminal means; and
   a quantity of flowable conductive adhesive material applied between the main electrode and the internal terminal means for conductively adhering the same;
   the improvement comprising:
   a ridge-shaped bulkhead formed on said bottom interior surface and traversing substantially the entire bottom interior surface in the vicinity of said internal terminal means and said main electrode, substantially all of said bulkhead contacting said bottom surface of said piezo-electric element without damping vibrations thereof, which maintains a clearance between said bottom surface of said piezo-electric element and said bottom portion of said case, and prevents substantial flowing of any of said flowable conductive adhesive material away from said vicinity of said internal terminal means and said main electrode.

2. The improvement of claim 1, wherein said piezo-electric assembly comprises two of said internal terminal means each conductively adhered to a respective main electrode of said piezo-electric element; and
   a second ridge-shaped bulkhead is formed on said interior surface of said bottom portion of said case between said two internal terminal means, and contacting said bottom surface to said piezoelectric element between said two main electrodes, said second bulkhead preventing substantial flowing of any of said flowable conductive adhesive material between said two internal terminal means or between said two main electrodes.

3. The improvement of claim 1, wherein said bottom surface of said piezo-electric element has a vibrating portion, and said bulkhead contacts said bottom surface between said vibrating portion and said main electrode to avoid any damping of such vibration.

4. The improvement of claim 1, wherein said piezo-electric element has a top surface having a top electrode thereon;

said bottom portion of said case has a further internal terminal means to be connected to said top electrode but separated therefrom by said piezo-electric element;

said case has a side wall fixed to said bottom portion and closely surrounding said piezo-electric element; and has a detour path formed in said side wall from near said top electrode to near said further terminal means, said detour path accommodating a quantity of flowable conductive adhesive material which conductively adheres said top electrode to said further internal terminal means.

5. The improvement of claim 1, wherein said first and second ridge-shaped bulkheads are integrally formed with each other and with said bottom portion of said case, said second bulkhead extends from a portion of said first bulkhead to a portion of said side wall, and said first bulkhead extends between two portions of said side wall.

* * * * *